(12) United States Patent
Shinada et al.

(10) Patent No.: US 12,531,219 B2
(45) Date of Patent: Jan. 20, 2026

(54) SUBSTRATE PROCESSING APPARATUS AND CLEANING METHOD

(71) Applicant: TOKYO ELECTRON LIMITED, Tokyo (JP)

(72) Inventors: Masato Shinada, Tokyo (JP); Yusuke Kikuchi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 129 days.

(21) Appl. No.: 18/511,890

(22) Filed: Nov. 16, 2023

(65) Prior Publication Data

US 2024/0177978 A1 May 30, 2024

(30) Foreign Application Priority Data

Nov. 28, 2022 (JP) ................... 2022-189076

(51) Int. Cl.
| | |
|---|---|
| C23C 14/54 | (2006.01) |
| B08B 5/00 | (2006.01) |
| B08B 7/00 | (2006.01) |
| B08B 7/04 | (2006.01) |
| C23C 14/34 | (2006.01) |
| C23C 14/50 | (2006.01) |
| H01J 37/32 | (2006.01) |
| H01J 37/34 | (2006.01) |

(52) U.S. Cl.
CPC .......... *H01J 37/32862* (2013.01); *B08B 5/00* (2013.01); *B08B 7/0092* (2013.01); *B08B 7/04* (2013.01); *C23C 14/34* (2013.01); *C23C 14/505* (2013.01); *H01J 37/32091* (2013.01); *H01J 37/32724* (2013.01); *H01J 37/3405* (2013.01); *H01J 2237/002* (2013.01); *H01J 2237/20214* (2013.01); *H01J 2237/332* (2013.01)

(58) Field of Classification Search
None
See application file for complete search history.

(56) References Cited

U.S. PATENT DOCUMENTS

| | | | |
|---|---|---|---|
| 2021/0162468 A1 | 6/2021 | Takayama et al. | |
| 2022/0238314 A1 | 7/2022 | Yamagata et al. | |
| 2023/0173558 A1 | 6/2023 | Takayama et al. | |

FOREIGN PATENT DOCUMENTS

| | | | |
|---|---|---|---|
| JP | 2002-158174 A | 5/2002 | |
| JP | 2009-246392 A | 10/2009 | |
| JP | 2020-072249 A | 5/2020 | |
| JP | 2021-086968 A | 6/2021 | |
| JP | 2022-112921 A | 8/2022 | |

*Primary Examiner* — Kaj K Olsen
*Assistant Examiner* — Ryan L Coleman
(74) *Attorney, Agent, or Firm* — Fenwick & West LLP

(57) ABSTRACT

Provided is a substrate processing apparatus comprising a processing chamber, a rotatable substrate support configured to hold a substrate in the processing chamber, a freezing device that is in contact with or separated from the substrate support and is configured to cool the substrate support, a mechanism configured to rotate the substrate support and raise and lower the freezing device, a power supply part configured to supply a radio frequency (RF) power, and a power supply line that penetrates through the freezing device, has a contact portion, and is configured to switch supply and stop of supply of the RF power by connecting the contact portion to a specific position of the substrate support or disconnecting the contact portion from the specific position of the substrate support.

12 Claims, 5 Drawing Sheets

*FIG.4A*     *FIG.4B*     *FIG.4C*
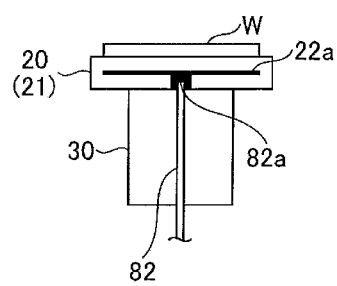 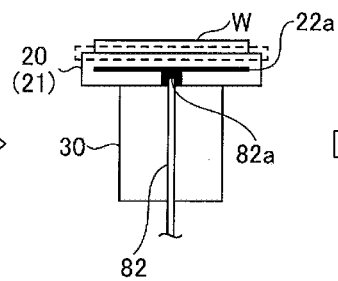 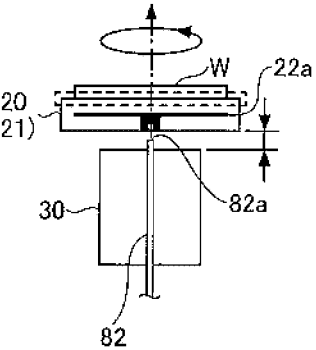
*FIG.4E*     *FIG.4D*
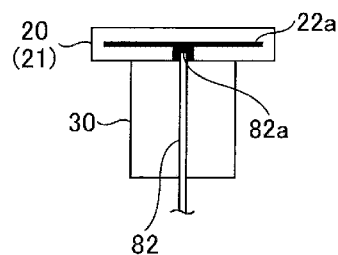 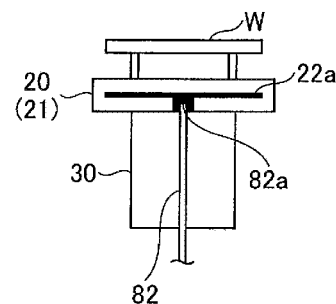

SUBSTRATE PROCESSING APPARATUS AND CLEANING METHOD

CROSS-REFERENCE TO RELATED APPLICATIONS

This application claims priority to Japanese Patent Application No. 2022-189076, filed on Nov. 28, 2022, the entire contents of which are incorporated herein by reference.

TECHNICAL FIELD

The present disclosure relates to a substrate processing apparatus and a cleaning method.

BACKGROUND

For example, Japanese Laid-open Patent Publication No. 2021-86968 suggests a cleaning method for cleaning a substrate support in a plasma processing apparatus by removing deposits deposited on an outer peripheral portion of the substrate support while suppressing damage to the substrate support. This cleaning method includes a separating step and a removing step. In the separating step, the substrate support and a substrate are separated using a lifting mechanism. In the removing step, the deposits deposited on the substrate support are removed after the separating step by supplying a radio frequency (RF) power from an RF power supply to the substrate support and generating plasma. Further, in the separating step, a separation distance between the substrate support and the substrate is set such that a combined impedance formed around the outer peripheral portion of the substrate support becomes lower than that formed directly above the center of the substrate support.

For example, Japanese Laid-open Patent Publication No. 2009-246392 suggests a substrate processing apparatus in which an impedance matching state is maintained without considerable changes even if a substrate holder moves. This substrate processing apparatus includes a processing chamber, a substrate holder disposed in the processing chamber to hold a substrate, a radio frequency (RF) power supply for supplying an RF power to the substrate holder, a matching device electrically connected between the substrate holder and the RF power supply, and a moving mechanism for moving the matching device and the substrate holder together.

SUMMARY

The present disclosure provides a technique capable of controlling supply and stop of supply of a radio frequency (RF) power depending on whether a substrate support and a freezing device are in contact with each other or separated from each other.

In accordance with an aspect of the present disclosure, there is provided a substrate processing apparatus comprising a processing chamber, a rotatable substrate support configured to hold a substrate in the processing chamber, a freezing device that is in contact with or separated from the substrate support and is configured to cool the substrate support, a mechanism configured to rotate the substrate support and raise and lower the freezing device, a power supply part configured to supply a radio frequency (RF) power, and a power supply line that penetrates through the freezing device, has a contact portion, and is configured to switch supply and stop of supply of the RF power by connecting the contact portion to a specific position of the substrate support or disconnecting the contact portion from the specific position of the substrate support.

BRIEF DESCRIPTION OF THE DRAWINGS

FIGS. 4A to 4E explain an operation of the substrate support and a freezing device according to one embodiment.

DETAILED DESCRIPTION

Figure 1:
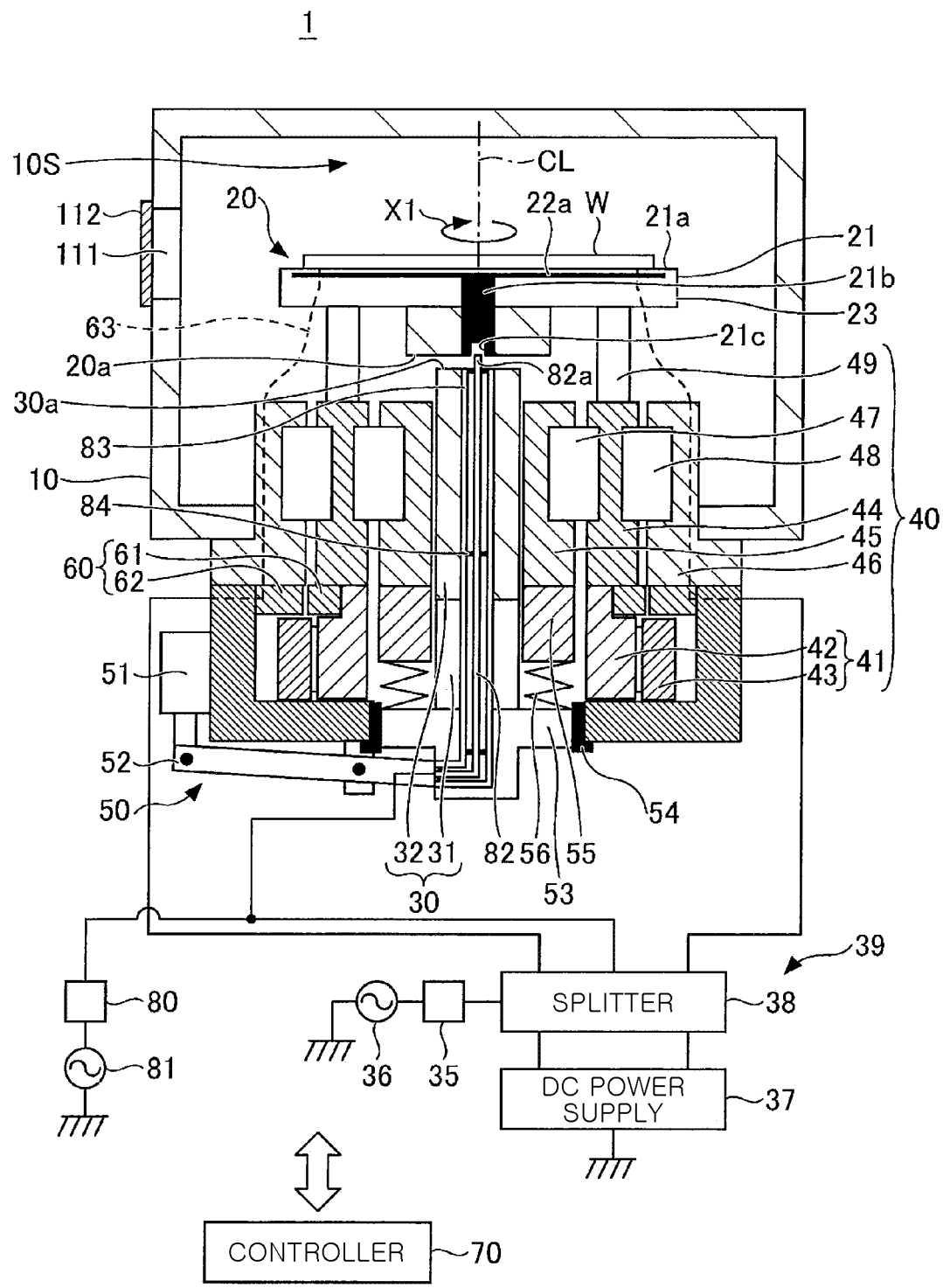
FIG. 1 is a cross-sectional view showing a configuration example of a substrate processing apparatus during rotation of a substrate support according to one embodiment.

Hereinafter, embodiments of the present disclosure will be described with reference to the accompanying drawings. Like reference numerals will be given to like or corresponding parts throughout the drawings, and redundant description thereof may be omitted.

In this specification, directions such as parallel, right-angled, orthogonal, horizontal, vertical, up and down, and left and right are allowed to deviate without spoiling the effect of the embodiment. The shape of a corner is not limited to a right angle and may be rounded in an arch shape. The terms parallel, right-angled, orthogonal, horizontal, vertical, circular, and equal may include substantially parallel, substantially right-angled, substantially orthogonal, substantially horizontal, substantially vertical, substantially circular, and substantially equal, respectively.

(Substrate Processing Apparatus)

Figure 2:
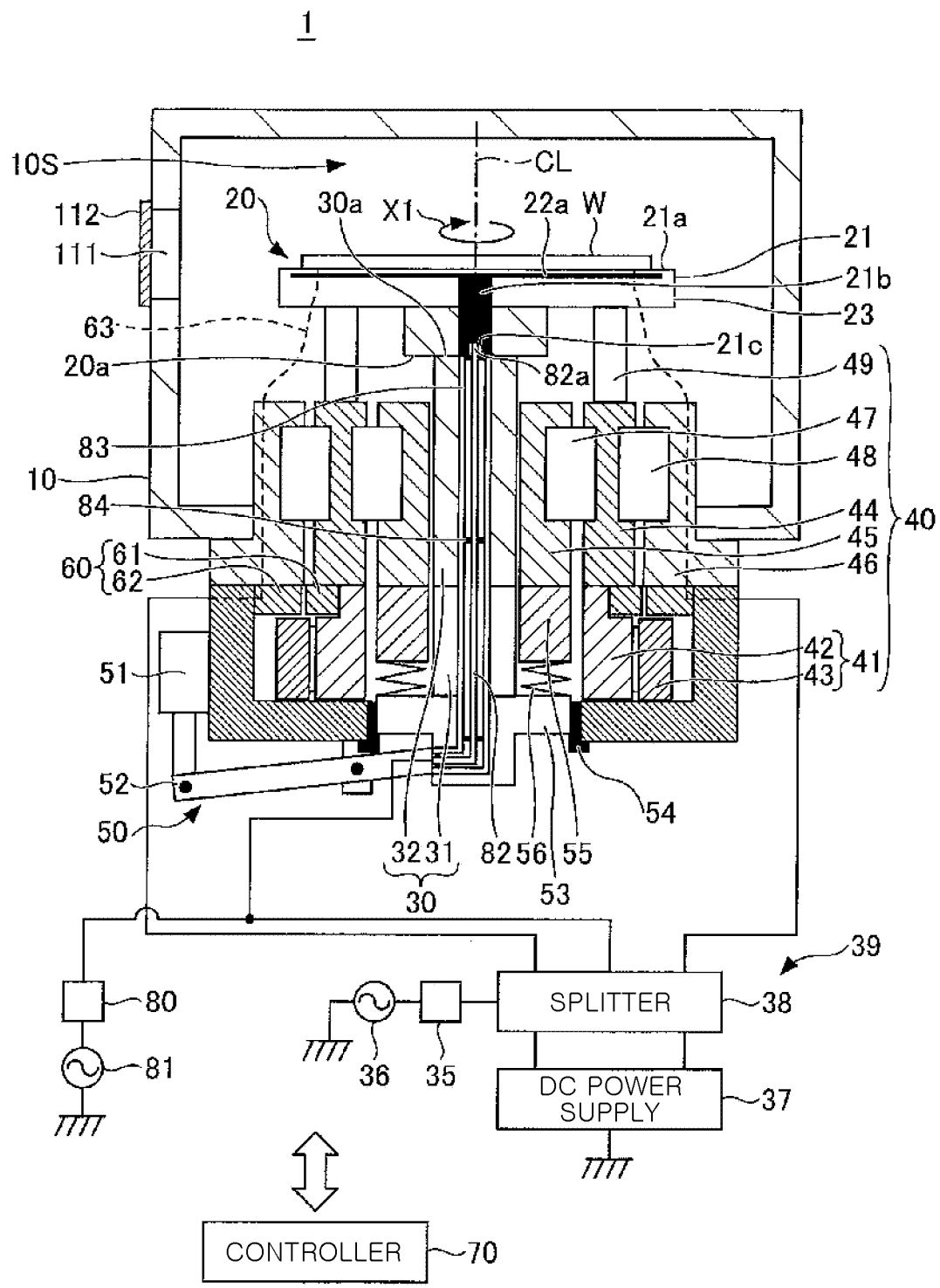
FIG. 2 is a cross-sectional view showing an example of a configuration of the substrate processing apparatus during cooling of the substrate support according to one embodiment.

An example of a substrate processing apparatus 1 according to one embodiment will be described using FIGS. 1 and 2. FIG. 1 is a cross-sectional view showing an example of a configuration of a substrate processing apparatus 1 during rotation of a substrate support 20 according to one embodiment. FIG. 2 is a cross-sectional view showing a configuration example of the substrate processing apparatus 1 during cooling of the substrate support 20 according to one embodiment.

The substrate processing apparatus 1 may be, for example, a chemical vapor deposition (CVD) apparatus or an atomic layer deposition (ALD) apparatus that supplies a processing gas into the processing chamber 10 and performs desired processing (for example, film formation) on a substrate W. Further, the substrate processing apparatus 1 may be, for example, a physical vapor deposition (PVD) apparatus that supplies a processing gas into the processing chamber 10 and sputters a target disposed in the processing chamber 10 to form a film on the substrate W.

A case where the substrate processing apparatus 1 is a PVD apparatus will be described. In this case, one or more targets are disposed at a ceiling portion of the processing chamber 10. In the substrate processing apparatus 1, film formation is performed on the substrate W by depositing sputtered particles (film forming atoms) emitted from one or more targets to the surface of the substrate W such as a semiconductor wafer placed on the substrate support 20 in the processing chamber 10. Further, the substrate processing apparatus 1 has a cathode part serving as a sputtering source at the ceiling portion of the processing chamber 10. The substrate processing apparatus 1 is, for example, a magnetron sputtering apparatus.

The substrate processing apparatus 1 includes the processing chamber 10, the substrate support 20 on which the substrate W is placed in the processing chamber 10, a freezing device 30, a rotating device 40 for rotating the substrate support 20, and a lifting device 50 for raising and lowering the freezing device 30. Further, the substrate processing apparatus 1 includes a controller 70 for controlling various components such as the freezing device 30, the rotating device 40, and the lifting device 50.

The substrate support 20 for placing the substrate W thereon is disposed in the processing chamber 10. The processing chamber 10 has an inner space 10S above the substrate support 20. The processing chamber 10 is configured such that a pressure in the inner space 10S is reduced to an ultra-high vacuum state by operating an exhaust device (not shown) such as a vacuum pump or the like. Further, a desired gas used for substrate processing is supplied into the processing chamber 10 through a gas supply line (not shown) communicating with a gas supply part (not shown).

The substrate support 20 holds the substrate W in the processing chamber 10, and is rotatable by the rotating device 40. The substrate support 20 has an electrostatic chuck 21 and a base 23. The electrostatic chuck 21 is formed on the base 23. The electrostatic chuck 21 has a structure in which the base 23 is coated with an insulating film such as alumina ($Al_2O_3$), a metal film such as copper, and a thermally sprayed film that is an insulating film. The metal film embedded in the insulating film serves as a chuck electrode (not shown). In other words, an upper insulating film (thermally spray film) of the chuck electrode serves as a placing surface 21a of the electrostatic chuck 21. The electrostatic chuck 21 may be of a Johnson-Rahbeck force type or a Coulomb force type.

The substrate processing apparatus 1 includes a power supply part 39. The power supply part 39 has a first radio frequency (RF) power supply 36 for supplying a bias RF power having a first frequency, a second RF power supply 81 for supplying a cleaning RF power having a second frequency, and a DC voltage power supply 37 for supplying a DC voltage to the chuck electrode.

Further, the substrate processing apparatus 1 includes a slip ring 60 made of a metal. The slip ring 60 includes a rotating body 61 made of a metal and having a metal ring disposed below a rotation shaft 44 and a housing 46 of the rotating device 40, and a fixed body 62 having a brush.

The rotating body 61 has a substantially cylindrical shape extending coaxially with the rotation shaft 44, and is fixed to the bottom surface of the rotation shaft 44. The fixed body 62 has a substantially cylindrical shape with an inner diameter slightly larger than an outer diameter of the rotating body 61, and is fixed to the bottom surface of the housing 46.

The slip ring 60 is electrically connected to the DC power supply 37 and supplies a power from the DC power supply 37 to a wiring 63 via the brush of the fixed body 62 and the metal ring of the rotating body 61. The DC power supply 37 applies a DC voltage to the chuck electrode via the slip ring 60 and the wiring 63. With this configuration, the power supply part 39 can apply a potential from the DC power supply 37 to the chuck electrode without twisting the wiring 63. The slip ring 60 may have a structure other than the brush structure, for example, a contactless power supply structure, a mercury-free structure, a structure containing conductive liquid, or the like.

The power supply part 39 has a splitter 38. The splitter 38 splits the DC voltage applied from the DC power supply 37 to the chuck electrode, the bias RF power supplied from the first RF power supply 36 to the electrostatic chuck 21 (the substrate W), and the cleaning RF power supplied from the second RF power supply 81 to the substrate support 20. Since the RF power for cleaning is an alternating current (AC), a bias RF current also flows through the base 23 without being insulated by the insulating film covering the chuck electrode. The freezing device 30 is made of low resistance copper and is grounded. Therefore, if the base 23 is made of low-resistance copper, the bias RF power supplied to the electrostatic chuck 21 (the substrate W) flows toward the freezing device 30 connected to the ground without flowing to the wall of the processing chamber 10 through ionized particles, which makes it difficult to apply the bias RF power to the ionized particles. Accordingly, the base 23 is made of quartz, so that the bias RF current is prevented from flowing toward the freezing device 30 and the bias RF power is applied to the ionized particles. Since quartz is for the base 23, a potential difference occurs by supplying the bias RF power to the electrostatic chuck 21 (the substrate W) and the ionized sputtered particles can be attracted to the substrate W.

The DC voltage split by the splitter 38 is applied to the electrostatic chuck 21 (the chuck electrode) via the slip ring 60 and the wiring 63. The bias RF power split by the splitter 38 is supplied to the electrostatic chuck 21 (the substrate W) via the slip ring 60 and the wiring 63, and is superimposed on the DC voltage. The cleaning RF power split by the splitter 38 is supplied to an electrode part 22a disposed below the chuck electrode in the substrate support 20 via a power supply line 82 penetrating through the freezing device 30, which is a separate supply path from the slip ring 60 and the wiring 63. The electrode part 22a has a disc shape with a diameter that is substantially the same as or similar to that of the substrate support 20. Further, in the substrate processing apparatus 1 of the present embodiment, it is necessary to install a dedicated metal plate (not shown) for supplying a bias RF power in the base 23 made of quartz. There is no decrease in the cooling efficiency of the substrate support 20 due to the effect of insertion of the metal plate, and the same cooling performance as that obtained in the conventional case can be ensured.

The frequency (first frequency) of the bias RF power is, for example, 400 kHz. The frequency (second frequency) of the cleaning RF power is, for example, 13.56 MHZ. However, the first frequency is not limited to 400 kHz. Further, the second frequency is not limited to 13.56 MHZ. The second frequency may be the same as or different from the first frequency. The first RF power supply 36 is connected to a matching device 35 for efficiently applying a bias RF power to the substrate support 20, and is connected to the splitter 38 via the matching device 35. The second RF power supply 81 is connected to a matching device 80 for efficiently applying a cleaning RF power to the substrate support 20, and is connected to the splitter 38 via the matching device 80.

The freezing device 30 is disposed below the substrate support 20. The freezing device 30 is configured to be brought into contact with or separated from the substrate support 20 to cool the substrate support 20. The freezing device 30 includes a refrigerator 31 and a refrigeration medium 32. The refrigeration medium 32 is also referred to as cold ring. The refrigerator 31 holds the refrigeration medium 32 and cools the upper surface of the refrigeration medium 32 to an extremely low temperature. The refrigerator 31 preferably uses a Gifford-McMahon (GM) cycle in view of cooling performance. The refrigeration medium 32 is fixed on the refrigerator 31, and an upper portion of the refrigeration medium 32 is accommodated in the processing chamber 10. The refrigeration medium 32 is made of a material having high thermal conductivity (for example, Cu), and has a substantially cylindrical outer shape. The refrigeration medium 32 is disposed such that the center thereof coincides with a center axis CL of the substrate support 20.

The freezing device 30 has a contact surface 30a that is in contact with or separated from a surface to be contacted 20a of the substrate support 20, and is configured to cool the substrate support 20. When the substrate processing apparatus 1 is in an idle state, the lifting device 50 raises the freezing device 30 to bring a contact surface 30a of the freezing device 30 into contact with the surface to be contacted 20a of the substrate support 20, so that the freezing device 30 cools the substrate support 20 to an extremely low temperature. When the substrate processing apparatus 1 performs a process (processing of the substrate W), the lifting device 50 lowers the freezing device 30 to separate the contact surface 30a of the freezing device 30 from the surface to be contacted 20a of the substrate support 20 and, then, film formation is performed on the substrate W on the substrate support 20 while rotating the substrate support 20 using the rotating device 40.

For example, the freezing device 30 may be in contact with the surface to be contacted 20a of the substrate support 20 and cool the electrostatic chuck 21 so that the temperature of the substrate W attracted and held on the placing surface 21a becomes an extremely low temperature of 150 K (Kelvin) or lower. Further, the freezing device 30 may be in contact with the surface to be contacted 20a of the substrate support 20 and cool the electrostatic chuck 21 so that the temperature of the substrate W becomes an extremely low temperature of 210 K (Kelvin) or lower. In the freezing device 30, at least the refrigeration medium 32 is made of a metal such as copper or the like, and is connected to the ground potential. In the present embodiment, portions of the freezing device 30 other than the refrigerator 31 are made of copper.

Further, the substrate support 20 is rotatably supported by a rotating device 40. The rotating device 40 has a rotation driving device 41, a fixed shaft 45, a rotation shaft 44, a housing 46, magnetic fluid seals 47 and 48, and a stand 49.

The rotation driving device 41 is a direct drive motor having a rotor 42 and a stator 43. The rotor 42 has a substantially cylindrical shape extending coaxially with the rotation shaft 44 and is fixed to the rotation shaft 44. The stator 43 has a substantially cylindrical shape with an inner diameter larger than the outer diameter of the rotor 42. The rotation driving device 41 may be in a form other than a direct drive motor, and may be in a form including a servomotor and a transmission belt.

The rotation shaft 44 has a substantially cylindrical shape that extends coaxially with the center axis CL of the substrate support 20. The fixed shaft 45 is provided inside the rotation shaft 44 in a radial direction. The fixed shaft 45 has a substantially cylindrical shape extending coaxially with the center axis CL of the substrate support 20. The housing 46 is provided outside the rotation shaft 44 in a radial direction. The housing 46 has a substantially cylindrical shape extending coaxially with the center axis CL of the substrate support 20 and is fixed to the processing chamber 10.

The magnetic fluid seal 47 is provided between the outer peripheral surface of the fixed shaft 45 and the inner circumference of the rotation shaft 44. The magnetic fluid seal 47 rotatably supports the rotation shaft 44 with respect to the fixed shaft 45, and seals the gap between the outer peripheral surface of the fixed shaft 45 and the inner circumference of the rotation shaft 44 to separate the inner space 10S of the decompressible processing chamber 10 from the outer space of the processing chamber 10. The magnetic fluid seal 48 is provided between the inner peripheral surface of the housing 46 and the outer circumference of the rotation shaft 44. The magnetic fluid seal 48 rotatably supports the rotation shaft 44 with respect to the housing 46, and seals the gap between the inner peripheral surface of the housing 46 and the outer circumference of the rotation shaft 44 to separate the inner space 10S of the decompressible processing chamber 10 from the outer space of the processing chamber 10. Accordingly, the rotation shaft 44 is rotatably supported by the fixed shaft 45 and the housing 46. Further, the refrigeration medium 32 is inserted into the radially inner side of the fixed shaft 45.

The stand 49 is provided vertically between the rotation shaft 44 and the substrate support 20, and is configured to transmit the rotation of the rotation shaft 44 to the substrate support 20. With the above configuration, when the rotor 42 of the rotation driving device 41 rotates, the rotation shaft 44, the stand 49, and the substrate support 20 rotate in a X1 direction (see FIG. 1) relative to the refrigeration medium 32.

Further, the freezing device 30 is supported by the lifting device 50 to be vertically movable. The rotating device 40 and the lifting device 50 are examples of mechanisms for rotating the substrate support 20 and raising/lowering the freezing device 30.

The lifting device 50 has an air cylinder 51, a link mechanism 52, a freezing device support 53, a linear guide 54, a fixed portion 55, and a bellows 56.

The air cylinder 51 is a mechanical device whose rod moves linearly by air pressure. The link mechanism 52 converts the linear motion of the rod of the air cylinder 51 into vertical motion of the freezing device support 53. Further, the link mechanism 52 has a lever structure, one end of which is connected to the air cylinder 51 and the other end of which is connected to the freezing device support 53. Accordingly, a large pressing force can be generated with a small thrust of the air cylinder 51. The freezing device support 53 supports the freezing device 30 (the refrigerator 31 and the refrigeration medium 32). Further, the moving direction of the freezing device support 53 is guided in the vertical direction by the linear guide 54.

The fixed portion 55 is fixed to the bottom surface of the fixed shaft 45. The substantially cylindrical bellows 56 surrounding the refrigerator 31 is provided between the bottom surface of the fixed portion 55 and the upper surface of the freezing device support 53. The bellows 56 is a metal bellows structure that is vertically extensible/contractible. Accordingly, the fixed portion 55, the bellows 56, and the freezing device support 53 seal the gap between the inner peripheral surface of the fixed shaft 45 and the outer circumference of the refrigeration medium 32 to separate the inner space 10s of the decompressible processing chamber 10 from the outer space of the processing chamber 10. Further, the bottom surface side of the freezing device support 53 is adjacent to the outer space of the processing chamber 10, and the region surrounded by the bellows 56 on the upper surface side of the freezing device support 53 is adjacent to the inner space 10S of the processing chamber 10.

A loading/unloading port 111 and a gate valve 112 are disposed on the side surface of the processing chamber 10. The gate valve 112 opens and closes the loading/unloading port 111. When the gate valve 112 is opened, the substrate W is loaded into the processing chamber 10 through the loading/unloading port 111 by a transfer device (not shown) and placed on the electrostatic chuck 21. When the transfer device retreats from the loading/unloading port 111, the controller 70 closes the gate valve 112.

When the substrate processing apparatus 1 is a PVD apparatus, a cathode part (not shown) configured to sputter one or more targets is disposed at the ceiling portion of the processing chamber 10 to face the substrate support 20. The power supply connected to the cathode part may be at least one of a DC power supply and an RF power supply. At least one of a DC voltage and an RF power may be applied to the cathode part from at least one of a DC power supply and an RF power supply (not shown).

The controller 70 is, for example, a computer, and includes a central processing unit (CPU), a random access memory (RAM), a read only memory (ROM), an auxiliary storage device, and the like. The CPU operates based on programs stored in the ROM or the auxiliary storage device, and controls the operation of the substrate processing apparatus 1. The controller 70 can control the substrate processing apparatus 1 using a wired or wireless communication device.

(Switching Mechanism for Supplying and Stopping Supply of RF Power)

The substrate processing apparatus 1 of the present embodiment includes the power supply line 82 configured to switch supply and stop of supply of the RF power from the second RF power supply 81. The RF power from the second RF power supply 81 is a cleaning RF power in the present embodiment.

The power supply line 82 penetrates through the freezing device 30, and has a contact portion 82a at the tip end thereof. The contact portion 82a protrudes from the upper surface (the contact surface 30a) of the freezing device 30. The power supply line 82 can switch supply and stop of supply of the cleaning RF power by connecting the contact portion 82a to a specific position on the substrate support 20 or disconnecting the contact portion 82a from the specific position.

The specific position of the substrate support 20 is the position facing the contact portion 82a, and a recess 21c is formed at the specific position of the substrate support 20. The recess 21c is formed below a support portion 21b that supports the electrode part 22a at the center of the disc-shaped electrode part 22a. The recess 21c is recessed inward (toward the electrode part 22a) from the bottom surface of the support portion 21b, which is the same surface as the surface to be contacted 20a of the substrate support 20. The recess 21c is connected to the electrode part 22a through the support portion 21b. The electrode part 22a and the support portion 21b are made of a conductive material such as copper, aluminum, or an alloy of copper and aluminum.

The contact portion 82a is connected to or disconnected from the recess 21c by raising/lowering the freezing device 30 using the lifting device 50. For example, when the substrate processing apparatus 1 is in an idle state, the lifting device 50 raises the freezing device 30 to bring the freezing device 30 into contact with the substrate support 20 and cool the substrate support 20. In this case, the contact surface 30a of the freezing device 30 is brought into contact with the surface to be contacted 20a of the substrate support 20. Accordingly, the contact portion 82a is automatically inserted into the recess 21c to be in contact therewith, and the power supply line 82 is connected to the electrode part 22a through the contact portion 82a. Hence, when the substrate processing apparatus 1 is in an idle state, the inside of the processing chamber 10 can be cleaned by supplying the cleaning RF power to the electrode part 22a from the power supply line 82 by connecting the contact portion 82a to the specific position (the recess 21c) while cooling the substrate support 20.

In the present embodiment, when the substrate processing apparatus 1 performs a process (film formation on the substrate W), the bias RF power is supplied from the first RF power supply 36 to the electrostatic chuck 21. Accordingly, ionized sputtered particles can be efficiently attracted to the substrate support 20, and the efficiency of film formation on the substrate W by the sputtered particles can be increased.

Further, when the substrate processing apparatus 1 performs a process, the lifting device 50 lowers the freezing device 30 to separate the freezing device 30 from the substrate support 20 and, then, a film is formed on the substrate W on the substrate support 20 while rotating the substrate support 20 using the rotating device 40. Further, when the substrate processing apparatus 1 performs a process, the contact portion 82a is separated from the specific position (the recess 21c) to disconnect electrical connection, thereby stopping the supply of the cleaning RF power to the electrode part 22a.

As the substrates W subjected to film formation are continuously processed, impurities on the substrates W are adhered to the placing surface 21a of the electrostatic chuck 21, and the attractive force of the electrostatic chuck 21 decreases. Accordingly, an error may occur in the attractive force, or the cooling efficiency may deteriorate due to an increase in the leakage amount of the heat transfer gas. Conventionally, the surface of the electrostatic chuck 21 was cleaned using plasma by applying the RF power from the first RF power supply 36 to the substrate support 20 on which the substrate W is not placed, for example. Since, however, non-uniform plasma is formed on the surface of the substrate support 20, the surface of the substrate support 20 was not cleaned uniformly. If the entire substrate support 20 is not cleaned uniformly, non-uniform temperature distribution may occur during the process. Further, conventionally, in order to restore the attractive force of the electrostatic chuck 21, it was necessary to replace the electrostatic chuck 21 (the substrate support 20) and install a dedicated cleaning tool. In this case, the running cost increases since the production efficiency deteriorates due to an increase in downtime for maintenance and it is necessary to secure an inventory of the dedicated cleaning tool or the replacement electrostatic chucks 21. From the above, there has been a demand for efficient cleaning that can be performed in-situ without breaking the vacuum without exposing the processing chamber 10 to the atmosphere for the replacement of the electrostatic chuck 21 or the like.

Thus, in the present embodiment, after a set number of substrates W (for example, 100) are processed, cleaning is performed during an idle state, that is, between processes, without causing downtime. In this case, plasma is produced from the cleaning gas supplied into the processing chamber 10 by the cleaning RF power supplied from the second RF power supply 81 to the electrode part 22a through the power supply line 82, and the processing chamber 10 is cleaned by the plasma. In this case, by supplying the cleaning RF power to the disc-shaped electrode part 22*a* in the substrate support 20, ions in the plasma can be sputtered uniformly to the entire substrate support 20 as a sputtering target using the plasma produced from the cleaning gas. Accordingly, the entire substrate support 20 can be uniformly cleaned without uncleaned portions.

Further, the cleaning method of the present embodiment can be performed while cooling the substrate support 20 when the substrate processing apparatus 1 is in an idle state before the process, between the processes, or after the process. Therefore, in the substrate processing apparatus 1 of the present embodiment, which performs film formation in an extremely low temperature environment, efficient cleaning can be performed. Even if the substrate processing apparatus 1 is in an idle state, the cleaning is not performed until the number of processed substrates W has not reached the set number.

In the present embodiment, when the substrate processing apparatus 1 performs a process, the lifting device 50 is lowered to separate the freezing device 30 from the substrate support 20, and a film is formed on the substrate W on the substrate support 20 while rotating the substrate support 20 using the rotating device 40. In this case, the freezing device 30 is separated from the substrate support 20, so that the contact portion 82*a* is automatically separated and disconnected from the specific position (the recess 21*c*). Hence, the supply of the cleaning RF power to the electrode part 22*a* can be automatically stopped.

The neighboring structure of the power supply line 82 will be further explained with reference to FIG. 1. The power supply line 82 is inserted into a through-hole formed in the freezing device 30. Although the through-hole is formed such that the center thereof coincides with the center axis CL, the present disclosure is not limited thereto. The power supply line 82 is made of a conductive material, e.g., copper. The power supply line 82 is not electrically connected to the freezing device 30. For example, as shown in FIG. 1, a protective portion 83 of a cylindrical insulating member is disposed between the inner wall of the through-hole of the freezing device 30 and the power supply line 82. The power supply line 82 is disposed in the protective portion 83.

A cavity may be disposed between the power supply line 82 and the protective portion 83. The power supply line 82 and the freezing device 30 are thermally and electrically insulated by the protective portion 83 of the insulating member and the cavity. The power supply line 82 is fixed at one or more positions in the freezing device 30 by a support portion 84 of an insulating member. The insulating members of the protective portion 83 and the support portion 84 may be made of ceramic with low thermal conductivity. For example, the power supply line 82 may be fixed by the support portion 84 of the insulating member at multiple locations, such as the tip end of the power supply line 82 or its vicinity, the base end of the power supply line 82 or its vicinity, the center of the power supply line 82, and the like. Hence, the power supply line 82 can be thermally and electrically insulated from the freezing device 30 (the refrigeration medium 32) by the insulating member, and can be fixed in the space of the through-hole by the support portion 84. Accordingly, the cleaning RF power can be stably supplied from the power supply line 82 to the electrode part 22*a* via the contact portion 82*a*.

Instead of providing the protective portion 83 of the cylindrical insulating member between the inner wall of the through-hole of the freezing device 30 and the power supply line 82, an insulating material such as ceramic or the like may fill the gap between the inner wall of the through-hole of the freezing device 30 and the power supply line 82. In this case as well, the insulation between the freezing device 30 and the power supply line 82 can be ensured.

In the substrate processing apparatus 1 of the present embodiment, the frequency (second frequency) of the cleaning RF power is set to a frequency band for generating capacitively coupled plasma, e.g., about 13 MHz or the like. On the other hand, the frequency (first frequency) of the bias RF power may be set to various frequencies depending on types of gases used for the process (film formation of the substrate W).

Further, the bias RF power is supplied to the surface of the electrostatic chuck 21 of the substrate support 20 in order to attract ions in the plasma toward the substrate W. On the other hand, the cleaning RF power is preferably supplied to the electrode part 22*a* of the substrate support 20 as well as the surface of the electrostatic chuck 21 in order to clean the entire substrate support 20.

From the above, it is preferable to separately provide the first RF power supply 36 for supplying the bias RF power and the second RF power supply 81 for supplying the cleaning RF power having the second frequency. Accordingly, the first RF power supply 36 supplies the RF power having the first frequency in the frequency band corresponding to each process, which makes it possible to increase a degree of freedom of the film formation that can be executed in the substrate processing apparatus 1. Further, the entire substrate support 20 as well as the surface of the electrostatic chuck 21 can be cleaned by supplying the RF power having the second frequency corresponding to cleaning from the second RF power supply 81, which is different from the first frequency.

(Substrate Processing Method)

Figure 3:
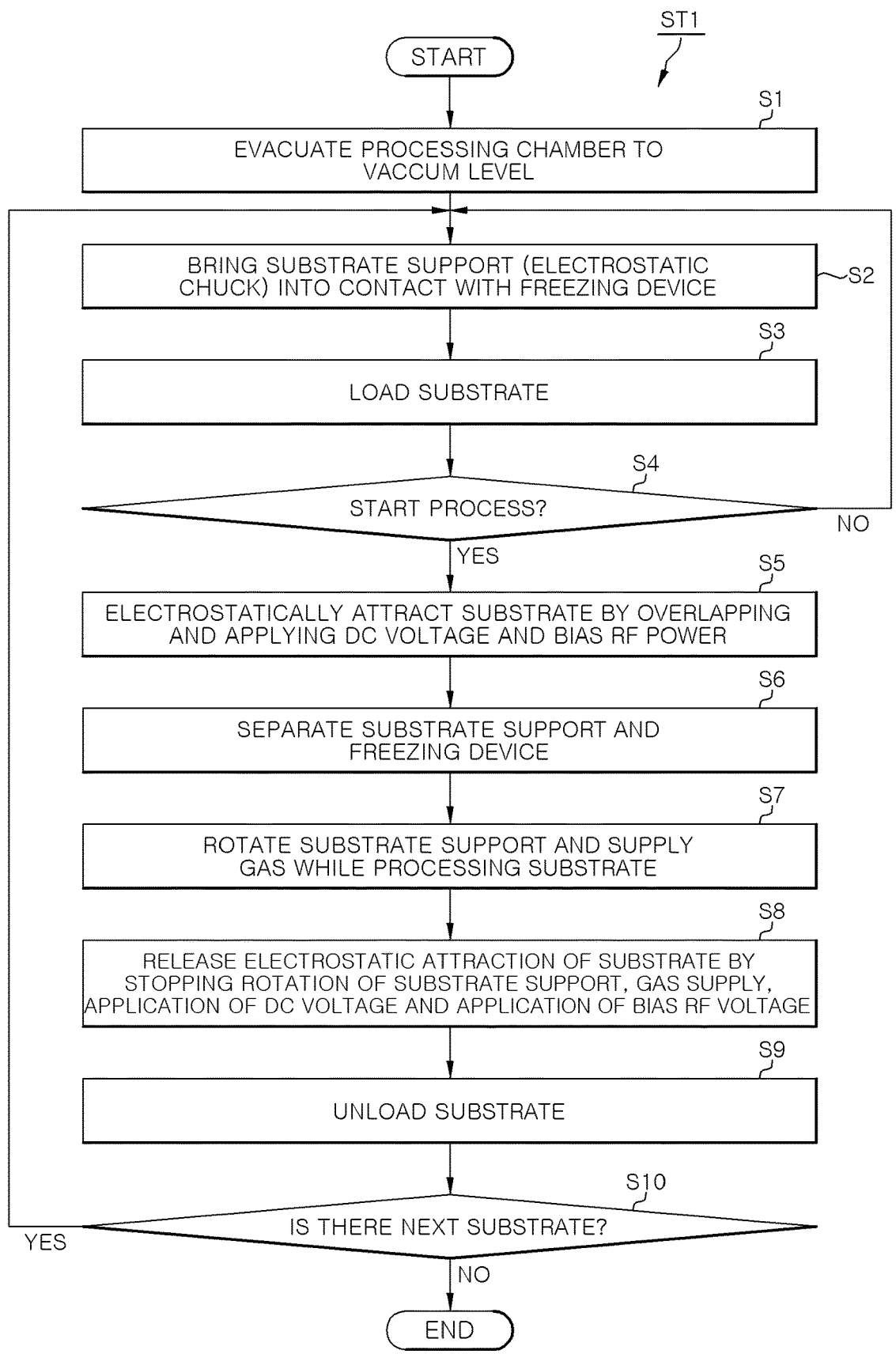
FIG. 3 is a flowchart showing an example of a substrate processing method according to one embodiment.

A substrate processing method ST1 according to one embodiment will be described with reference to FIGS. 3 and 4A to 4E. FIG. 3 is a flowchart showing an example of the substrate processing method ST1 according to one embodiment. FIGS. 4A to 4E explain the operation of the substrate support 20 (the electrostatic chuck 21) and the freezing device 30 according to one embodiment. The substrate processing method ST1 is controlled by the controller 70 and executed by the substrate processing apparatus 1. In the substrate processing method ST1, a desired film is formed on the substrate W.

When the substrate processing method ST1 is started, in step S1, the controller 70 controls a gas exhaust part to evacuate (decompress) the processing chamber 10 to a predetermined vacuum level.

Next, in step S2, the controller 70 raises the lifting device 50 to bring the substrate support 20 (the electrostatic chuck 21) into contact with the freezing device 30, and cools the substrate support 20 to an extremely low temperature (for example, 150 K or lower).

Next, in step S3, the substrate W is loaded into the processing chamber 10 and placed on the substrate support 20 (see FIG. 4A). Specifically, the controller 70 opens the gate valve 112, and the substrate W is loaded into the processing chamber 10 through the loading/unloading port 111 and placed on the substrate support 20 by a transfer device (not shown). When the transfer device retreats from the loading/unloading port 111, the controller 70 closes the gate valve 112.

Next, in step S4, the controller 70 determines whether to start a process. When the controller 70 determines not to start the process, the processing returns to step S2 and the cooling of the substrate support 20 is continued.

On the other hand, when the controller 70 determines to start the process in step S4, in step S5, the controller 70 applies a DC voltage from the DC power supply 37 to the chuck electrode of the electrostatic chuck 21, so that the substrate W is electrostatically attracted to the chuck 21 (see FIG. 4B). Further, the controller 70 supplies the bias RF power from the first RF power supply 36 to the substrate support 20 (the electrostatic chuck 21). Since the substrate W is electrostatically attracted to the electrostatic chuck 21, the cooling efficiency can be increased. In addition, a heat transfer gas channel (not shown) may be formed in the electrostatic chuck 21 to supply a heat transfer gas to the gap between the substrate W and the electrostatic chuck 21. Accordingly, the heat transfer efficiency can be increased.

Next, in step S6, the controller 70 lowers the lifting device 50 to separate the substrate support 20 and the freezing device 30 (see FIG. 4C). Next, in step S7, the controller 70 controls the rotating device 40 to rotate the substrate support 20 holding the substrate W (see FIG. 4C). Accordingly, the distribution of the film formed on the substrate W can be improved. Further, the controller 70 supplies a process gas (film forming gas) from the gas supply part. Ions in the plasma produced from the process gas collide with a target (not shown), and sputtered particles are emitted from the target into the inner space 10S. The emitted sputtered particles are ionized with high efficiency, and the ions can be attracted to the substrate support 20 (the electrostatic chuck 21) by the bias RF power. Accordingly, sputtered particles are efficiently adhered (deposited) to the substrate W, and a Cu film or the like can be formed.

When the process is completed, in step S8, the controller 70 controls the rotating device 40 to stop the rotation of the substrate support 20 and stop the supply of the process gas from the gas supply part. Further, the controller 70 stops the application of the DC voltage to the electrostatic chuck 21 and the supply of the bias RF power, and releases the electrostatic attraction of the substrate W to the electrostatic chuck 21 (see FIG. 4D). The controller 70 may release the electrostatic attraction of the substrate W to the electrostatic chuck 21 by applying a DC voltage whose polarity is opposite to that applied in the process to the electrostatic chuck 21.

Next, in step S9, the controller 70 opens the gate valve 112, and the substrate W is unloaded from the processing chamber 10 through the loading/unloading port 111 by a transfer device (not shown) (see FIGS. 4D and 4E). When the transfer device is retracted from the loading/unloading port 111, the controller 70 closes the gate valve 112.

Next, in step S10, the controller 70 determines whether or not there is a next substrate W to be subjected to film formation. When the controller 70 determines that there is a next substrate W, the processing returns to step S2 and the processes from step S2 are performed on the next substrate W (see FIG. 4A). When it is determined in step S10 that there is no next substrate W, the processing is completed.

In the case of cooling the substrate W, the substrate W is cooled to an extremely low temperature of about 72 K (Kelvin), that is, about −200° C. However, the extremely low temperature is not limited to −200° C., and may be within a range of −233° C. and −123° C. For example, when a film such as a Cu film is formed on the substrate W in a state where the substrate W is cooled to an extremely low temperature, aggregation of Cu particles can be suppressed. Accordingly, the sheet resistance and the surface roughness of the film such as a Cu film can be reduced compared to those obtained in the case of performing film formation at room temperature, and a film, e.g., a Cu film, having good quality can be formed.

Since the substrate W is electrostatically attracted to the electrostatic chuck 21, the cooling efficiency can be increased. Further, ions can be attracted to the substrate W by the bias RF power during the film formation on the substrate W, and the film formation efficiency can be improved.

(Cleaning Method)

Figure 5:
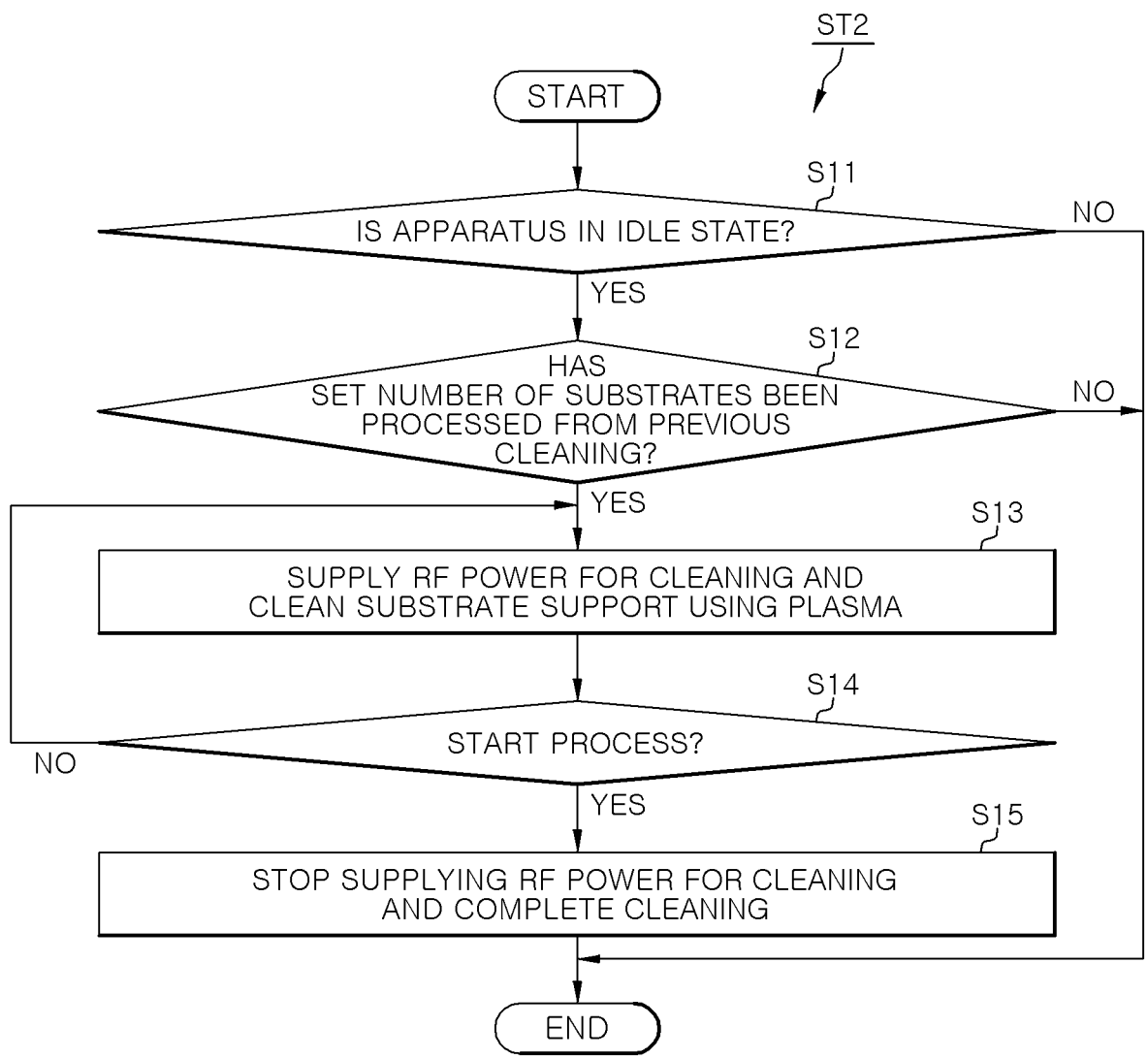
FIG. 5 is a flowchart showing an example of a cleaning method according to one embodiment.

A cleaning method ST2 according to one embodiment will be described with reference to FIG. 5. FIG. 5 is a flowchart showing an example of the cleaning method ST2 according to one embodiment. The cleaning method ST2 is controlled by the controller 70 and executed in the substrate processing apparatus 1.

When the processing is started, in step S11, the controller 70 determines whether or not the substrate processing apparatus 1 is in an idle state. When the controller 70 determines that the substrate processing apparatus 1 is not in an idle state, the processing is completed.

On the other hand, when it is determines in step S11 that the substrate processing apparatus 1 is in an idle state, in step S12, the controller 70 determines whether or not the set number of substrates W have been processed from previous cleaning. The set number of sheets is used for determining the cleaning cycle, and is preset to the number of sheets corresponding to the period for cleaning the substrate support 20 or the like. The set number of sheets is, for example, 100, but is not limited thereto. The set number of substrates W is set to be smaller than the number of substrates W that are continuously processed, in which the phenomenon that the attractive force of the electrostatic chuck 21 decreases due to adhesion of impurities on the substrates W to the placing surface 21a of the electrostatic chuck 21 occurs.

If it is determined that the set number of substrates W have not been processed from the previous cleaning, the controller 70 completes the processing. On the other hand, when it is determined in step S12 that the set number of substrates W have been processed from the previous cleaning, in step S13, the controller 70 controls the second RF power supply 81 to supply the cleaning RF power. During the idle state, the substrate support 20 and the freezing device 30 are in contact with each other in step S2 of FIG. 3, and the contact portion 82a is automatically connected to the recess 21c (see FIGS. 4A and 4B).

Accordingly, the cleaning RF power is supplied from the power supply line 82 to the electrode part 22a of the substrate support 20 via the contact portion 82a. Plasma is produced from the cleaning gas supplied into the processing chamber 10, and the entire substrate support 20 is cleaned by the generated plasma.

Next, in step S14, the controller 70 determines whether to start a process. If the controller 70 determines not to start the process, the processing returns to step S13 and the cleaning is continued.

On the other hand, if it is determined in step S14 that the controller 70 determines to start the process, the substrate support 20 and the freezing device 30 are separated (steps S4 to S6 in FIG. 3). Accordingly, the contact portion 82a and the recess 21c of the substrate support 20 are automatically disconnected (see FIG. 4C). Hence, in step S15, the controller 70 completes the cleaning by stopping the supply of the cleaning RF power, and completes the processing. As described above, in accordance with the substrate processing apparatus 1 and the cleaning method of the present embodiment, it is possible to automatically control supply and stop of supply of the RF power depending on whether or not the substrate support 20 and the freezing device 30 are in contact with each other or separated from each other.

The substrate processing apparatus 1 and the cleaning method according to the embodiments of the present disclosure are illustrative in all respects and are not restrictive. The above-described embodiments may be changed or modified in various forms without departing from the scope of the appended claims and the gist thereof. The above-described embodiments may include other configurations without contradicting each other and may be combined without contradicting each other.

The invention claimed is:

1. A substrate processing apparatus comprising:
a processing chamber;
a rotatable substrate support configured to hold a substrate in the processing chamber;
a freezing device that is configured to cool the substrate support;
a first mechanism configured to selectively raise and selectively lower the freezing device, wherein the first mechanism can raise the freezing device such that the freezing device makes physical contact with the substrate support, and wherein the first mechanism can lower the freezing device such that the freezing device is not in physical contact with the substrate support;
a second mechanism configured to rotate the substrate support, wherein the substrate support is configured to be rotated by the second mechanism while the freezing device is not in physical contact with the substrate support;
a power supply part configured to supply radio frequency (RF) power; and
a power supply line that extends from the power supply part to a contact portion and penetrates through the freezing device, wherein the contact portion can be moved with the freezing part by the first mechanism, wherein the contact portion is configured to be able to deliver RF power from the power supply part when the contact portion is in physical contact with the substrate support at a contacting position, and wherein the first mechanism can lower the freezing part and the contact portion such that the contact portion is not in physical contact with the substrate support.

2. The substrate processing apparatus of claim 1, wherein the contacting position is located on the substrate support and faces the contact portion,
the substrate support has a recess at the contacting position,
the contact portion protrudes from an upper surface of the freezing device,
the contact portion is connected to the recess by raising the freezing device using the first mechanism, and
the contact portion is disconnected from the recess by lowering the freezing device using the first mechanism.

3. The substrate processing apparatus of claim 2, wherein the substrate support has an electrode part connected to the recess, and
RF power is supplied from the power supply line to the electrode part by connecting the contact portion to the recess.

4. The substrate processing apparatus of claim 3, wherein the processing chamber is cleaned by connecting the contact portion to the contacting position and supplying RF power from the power supply line to the electrode part while cooling the substrate support by the freezing device being in contact with the substrate support.

5. The substrate processing apparatus of claim 4, wherein plasma is produced from RF power supplied to the electrode part and from cleaning gas supplied into the processing chamber, wherein the processing chamber is cleaned by the plasma.

6. The substrate processing apparatus of claim 3, wherein when the substrate processing apparatus performs a process, a substrate on the substrate support is processed while rotating the substrate support after the freezing device is separated from the substrate support by the first mechanism, and the contact portion is disconnected from the contacting position.

7. The substrate processing apparatus of claim 1, wherein the contact portion and the power supply line are conductive members, and
the power supply line is covered with a protective portion of an insulating member in the freezing device.

8. The substrate processing apparatus of claim 7, wherein the power supply line is disposed in the protective portion, and is fixed at one or more positions inside the freezing device by a fixed part of an insulating member,
wherein the protective portion has a cylindrical shape.

9. The substrate processing apparatus of claim 1, wherein the power supply part has a first RF power supply configured to supply a bias RF power having a first frequency and a second RF power supply configured to supply a cleaning RF power having a second frequency,
the substrate support is connected to the second RF power supply through the power supply line, and
the substrate support is connected to the first RF power supply through a separate wiring from the power supply line.

10. The substrate processing apparatus of claim 9, wherein the second frequency is different from the first frequency.

11. A cleaning method for cleaning a substrate processing apparatus,
wherein the substrate processing apparatus includes:
a processing chamber;
a rotatable substrate support configured to hold a substrate in the processing chamber;
a freezing device that is configured to cool the substrate support;
a first mechanism configured to selectively raise and selectively lower the freezing device, wherein the first mechanism can raise the freezing device such that the freezing device makes physical contact with the substrate support, and wherein the first mechanism can lower the freezing device such that the freezing device is not in physical contact with the substrate support;
a second mechanism configured to rotate the substrate support, wherein the substrate support is configured to be rotated by the second mechanism while the freezing device is not in physical contact with the substrate support;
a power supply part configured to supply radio frequency (RF) power; and
a power supply line that extends from the power supply part to a contact portion and penetrates through the freezing device, wherein the contact portion can be moved with the freezing part by the first mechanism, wherein the contact portion is configured to be able to deliver RF power from the power supply part when the contact portion is in physical contact with the substrate support at a contacting position, and wherein the first mechanism can lower the freezing part and the contact portion such that the contact portion is not in physical contact with the substrate support, the cleaning method comprises:

cooling the substrate support by bringing the freezing device into contact with the substrate support using the first mechanism; and cleaning the processing chamber by connecting the contact portion to the contacting position and supplying RF power from the power supply line to the substrate support.

12. The cleaning method of claim 11, further comprising:

processing a substrate on the substrate support while rotating the substrate support after the freezing device is separated from the substrate support by the first mechanism; and stopping a supply of RF power to the substrate support by disconnecting the contact portion from the contacting position.

* * * * *